(12) United States Patent
Fujisawa (10) Patent No.: US 7,586,326 B2
(45) Date of Patent: Sep. 8, 2009

(54) INTEGRATED CIRCUIT APPARATUS

(75) Inventor: Hisanori Fujisawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 12/123,853

(22) Filed: May 20, 2008

(65) Prior Publication Data

US 2009/0045838 A1    Feb. 19, 2009

(30) Foreign Application Priority Data

Aug. 17, 2007    (JP)    ............... 2007-213029

(51) Int. Cl.
*H03K 19/173* (2006.01)
(52) U.S. Cl. .......................... 326/38; 326/47
(58) Field of Classification Search ............. 326/37–41, 326/47, 101
See application file for complete search history.

(56) References Cited

U.S. PATENT DOCUMENTS 5,646,545 A    7/1997    Trimberger et al.
6,961,842 B2 *    11/2005    Baxter .......................... 712/43
7,109,752 B1 *    9/2006    Schmit et al. .................. 326/40
7,532,030 B2 *    5/2009    Redgrave ...................... 326/38

FOREIGN PATENT DOCUMENTS

| JP | H 9-181599 | 7/1997 |
| JP | 2005-122514 | 5/2005 |
| JP | 2007-052602 | 3/2007 |

OTHER PUBLICATIONS

Lodewijk T. Smit, et al.; "Run-Time Mapping of Applications to a heterogeneous Reconfigurable Tiled System on Chip Architecture", The 2004 IEEE International Conference of Field Programmable Technology; pp. 421-424; 2004.

* cited by examiner

*Primary Examiner*—James Cho
(74) *Attorney, Agent, or Firm*—Hanify & King, P.C.

(57) ABSTRACT

An integrated circuit apparatus includes a reconfigurable arithmetic operation device and a control device that generates mapping data defining a circuit configuration of the reconfigurable arithmetic operation device whose circuit configuration is changed while a given application is running and another application is newly implemented and run. The control device generates mapping data defining an intermediate configuration to shift from a circuit configuration defined by first mapping data to a configuration defined by final mapping data through the intermediate configuration.

8 Claims, 7 Drawing Sheets

INTEGRATED CIRCUIT APPARATUS

CROSS-REFERENCE TO RELATED APPLICATIONS

This application is based upon and claims the benefit of priority from the prior Japanese Patent Application No. 2007-213029, filed on Aug. 17, 2007, the entire contents of which are incorporated herein by reference.

BACKGROUND OF THE INVENTION

1. Field of the Invention

The present invention relates to an integrated circuit apparatus having a reconfigurable circuit.

2. Description of the Related Art

Conventionally, a coarse-grain reconfigurable circuit capable of changing the circuit configuration of an arithmetic device according to an application to be implemented has been proposed. The coarse-grain reconfigurable circuit includes a plurality of processing elements (PE) capable of executing various kinds of commands, an internal connection network that connects the processing elements, and a configuration memory that stores configuration data. The configuration data defines signal paths in the internal connection network and arithmetic operation processing performed by the respective processing elements.

The configuration data is loaded to the configuration memory when an application is implemented in the reconfigurable circuit. With regard to the supply of the configuration data, for example, Japanese Patent Application Laid-open No. 2007-52602 proposes that at least a part of the reconfigurable circuit be configured as an initialization circuit in response to an external reset releasing signal at the time of power supply and after completion of this operation for configuring the initialization circuit, the supply of the configuration data commences in response to an internal reset releasing signal.

When plural applications are simultaneously executed, configuration data must be generated respectively to prevent different applications from using the same processing element or the same signal path and as technology that enables such data generation, a run-time mapping technology has been disclosed. According to the run-time mapping technology, configuration data is configured using a logical data flow graph that is not dependent on the arrangement of processing elements to be processed or physical signal paths between the processing elements. When applications that should be simultaneously implemented are specified, allocation of the processing elements or the signal paths is determined in such a manner that hardware resources do not overlap (see, for example, Lodewijk T. Smit, et al., "Run-Time Mapping of Applications to a Heterogeneous Reconfigurable Tiled System on Chip Architecture", The 2004 IEEE International Conference of Field Programmable Technology (U.S.), 2004, pp. 421-424).

As a method of newly implementing and running an application while another given application is running in a conventional coarse-grain reconfigurable circuit, a method of mapping the application to be newly run (hereinafter, "added application") without changing the mapping of the application that is being run (hereinafter, "existing application") can be considered. However, this method has a problem in that the mapping of the added application must be carried out exclusive of the hardware resources used by the existing application and hence, processing elements and/or wiring resources become obstacles impeding the mapping of the added application.

Thus, a method of re-mapping an existing application as required and also mapping an added application may be considered as an alternative. However, this method has a problem in that data undergoing processing is lost when mapping of the existing application is improperly changed. To avoid this problem, processing that is in progress must be interrupted before the mapping is changed.

To solve the problems associated with the conventional technology, it is an object of the present invention to provide an integrated circuit apparatus in which circuit configuration can be changed while a given application is running. It is another object of the present invention to provide an integrated circuit apparatus that can newly implement and run an application while another given application running.

SUMMARY OF THE INVENTION

It is an object of the present invention to at least solve the above problems in the conventional technologies.

An integrated circuit apparatus according to one aspect of the present invention includes an arithmetic operation device including a plurality of processing elements capable of executing commands and an internal connection network connecting the processing elements; and a control device that generates, based on a data flow graph of an application, mapping data defining processing particulars for each of the processing elements and signal paths of the internal connection network. The control device generates third mapping data obtained by an integration of first mapping data and second mapping data that are generated based on a first data-flow graph, are different from each other and are for a first application that is being implemented. The control device implements a circuit configuration for the arithmetic operation device based on the third mapping data, and subsequently implements the circuit configuration based on the second mapping data.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Referring to the accompanying drawings, exemplary embodiments according to the present invention are explained in detail below. Like reference numerals denote like structures and tautological explanation thereof is omitted.

Figure 1:
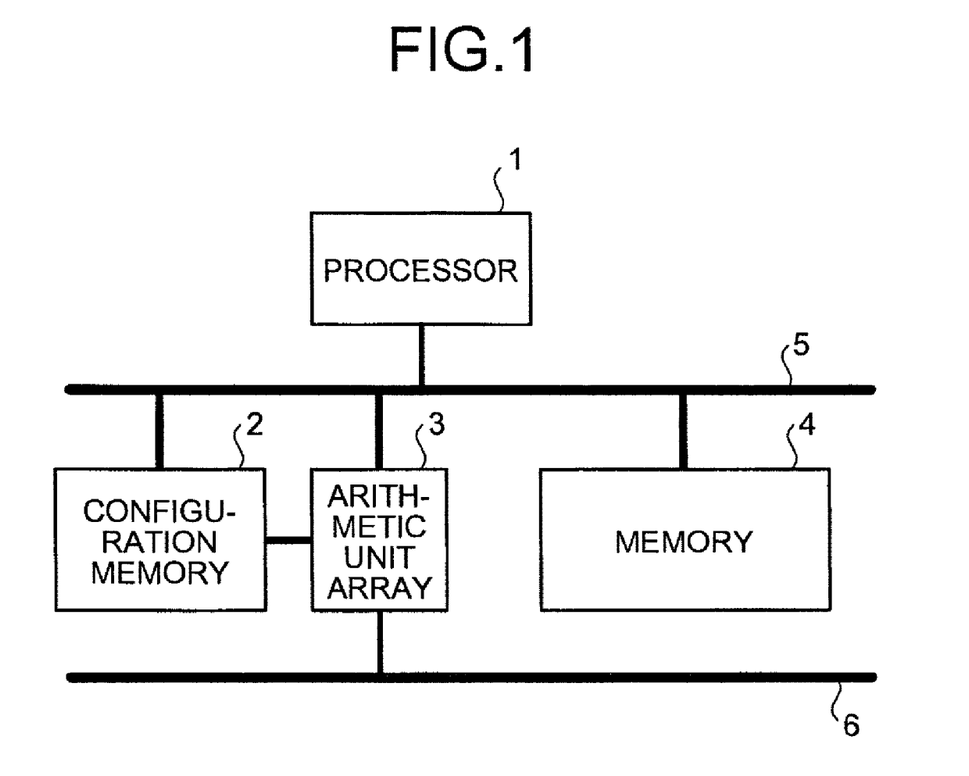
FIG. 1 is a block diagram of an integrated circuit apparatus according to a first embodiment of the present invention.

FIG. 1 is a block diagram of an integrated circuit apparatus according to the first embodiment of the present invention. As shown in FIG. 1, a processor 1, a configuration memory 2, an arithmetic unit array 3, and a memory 4 are connected through a configuration data bus 5. The arithmetic unit array 3 is connected with the configuration memory 2 and a data bus 6.

The arithmetic unit array 3 functions as an arithmetic device, and includes plural processing elements capable of executing various kinds of commands and an internal connection network that connects the processing elements. The processor 1 has a function of a control device and generates mapping data based on a logical data flow graph.

The processor 1 also calculates a later-explained identical state achieving time. The data flow graph is configuration data that is not dependent on a physical arrangement of the processing assigned to each processing element in the arithmetic unit array 3 or a physical signal path between the processing elements. Although not shown, nodes in the data flow graph respectively correspond to the processing of the processing element, and a branch between data graphs is indicative of a data path.

The mapping data is data that defines a physical arrangement or a physical signal path of the processing element having processing allocated thereto and a history dependent period indicating the extent of past data upon which internal data of the processing element is dependent. The configuration memory 2 stores mapping data generated by the processor 1.

Circuit configuration of the arithmetic unit array 3, i.e., the particulars of the processing performed by each processing element and signal paths of the internal connection network are determined based on the mapping data stored in the configuration memory 2. The processor 1 controls the timing of the transfer of the mapping data from the configuration memory 2 to the arithmetic unit array 3. The memory 4 stores a logical data flow graph of an application to be implemented and mapping data for the application being run.

Figure 2:
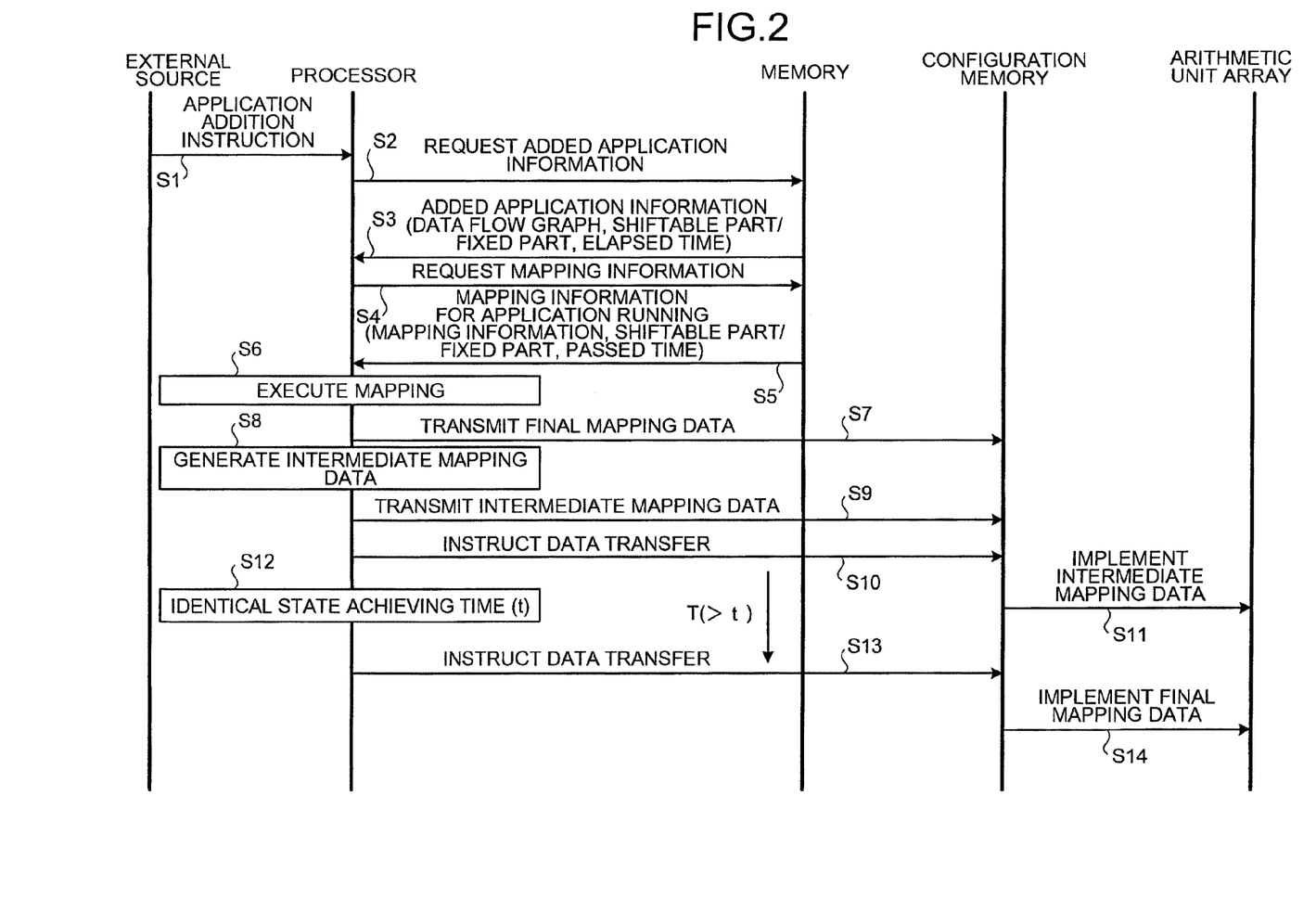
FIG. 2 is a flowchart of a processing procedure of the integrated circuit apparatus.

FIG. 2 is a flowchart of a processing procedure of the integrated circuit apparatus according to the first embodiment. As shown in FIG. 2, when the processor 1 receives, from an external source, an application addition instruction instructing the addition of an application while another given application is being run (step S1), the processor 1 transmits, to the memory 4, a request for information concerning the added-application (step S2). The processor 1 then reads a data flow graph of the added application from the memory 4 (step S3).

The processor 1 also transmits a mapping information request to the memory 4 (step S4). The processor 1 then reads a data flow graph and mapping information concerning an existing application from the memory 4 (step S5). Here, the number of applications that are being run may be one, two, or more. When two or more applications are running, the applications may be regarded as an application group.

The processor 1 then executes mapping based on the data flow graph of the added application and the data flow graph and the mapping information of the existing application read from the memory 4, and generates final mapping data that includes the added application (step S6). The processor 1 subsequently transmits the final mapping data that is generated to the configuration memory 2. The configuration memory 2 stores the final mapping data (step S7).

The processor 1 then generates intermediate mapping data for an intermediate state by integrating the final mapping data and the mapping data of the existing application (step S8). The processor 1 transmits the generated intermediate mapping data to the configuration memory 2. The configuration memory 2 stores the intermediate mapping data (step S9). The intermediate mapping data is explained hereinafter.

Then, the processor 1 transmits a data transfer command to the configuration memory 2 (step S10). Upon receiving the data transfer command, the configuration memory 2 implements the intermediate mapping data stored therein in the arithmetic unit array 3 (step S11). After transmitting the data transfer command to the configuration memory 2, the processor 1 calculates the time required for states to become identical (identical state achieving time) t (step S12).

This identical state achieving time t means the time required for the states of processing elements having the same function allocated thereto according to the mapping data for the existing application and the intermediate mapping data to become identical, the state of a processing element being indicated by the state of internal memory elements thereof. The identical state achieving time is explained hereinafter.

When the identical state achieving time t elapses after implementation of the intermediate mapping data in the arithmetic unit array 3, the processor 1 transmits a data transfer command to the configuration memory 2 (step S13). Upon receiving this data transfer command, the configuration memory 2 implements the final mapping data stored therein in the arithmetic unit array 3 (step S14). After successful implementation of the final mapping data, the processor 1 stores mapping data concerning final mapping in the memory 4 and terminates a series of processing.

Figure 3:
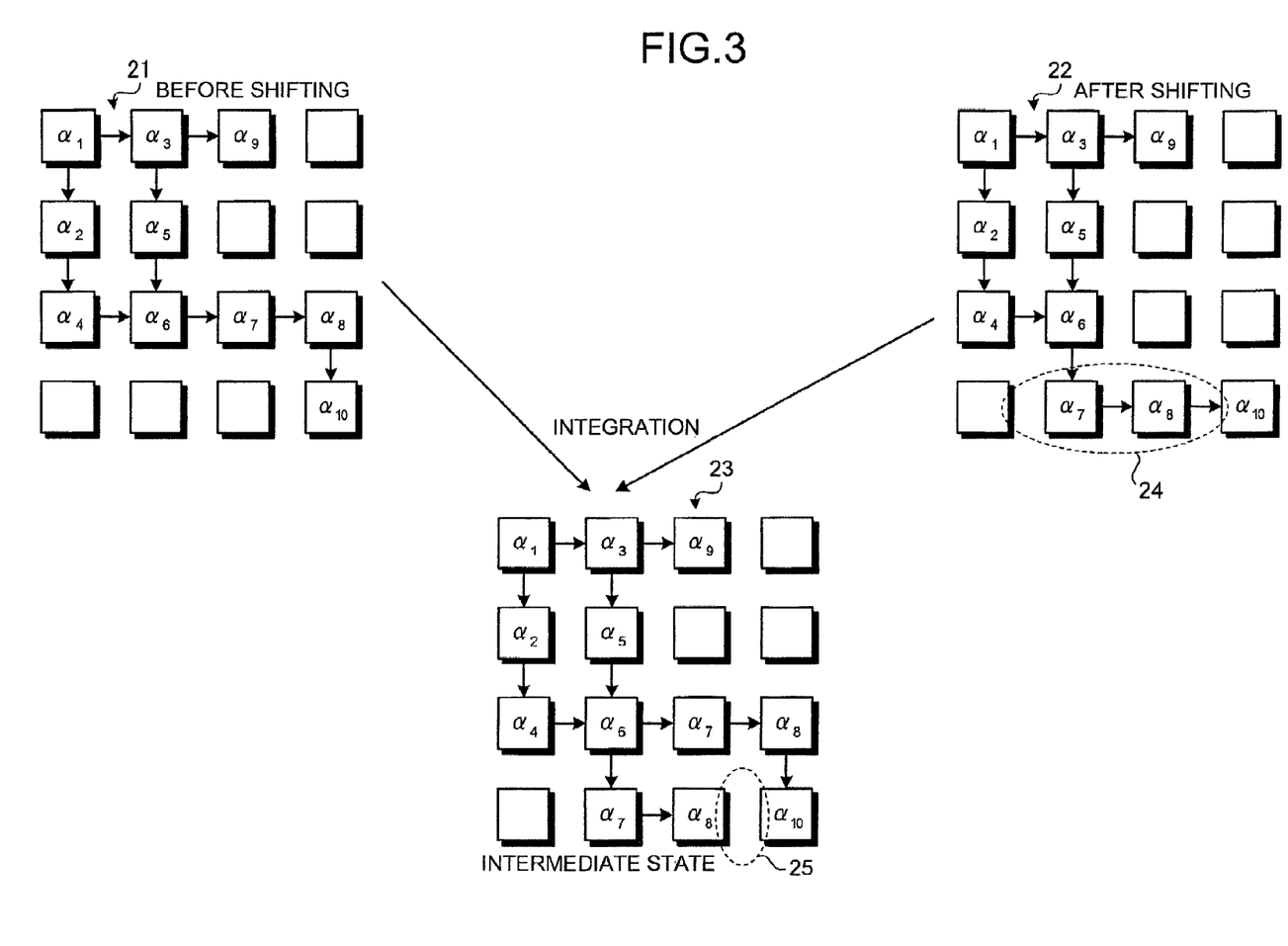
FIG. 3 is a view of configuration states for explaining the intermediate mapping data.

FIG. 3 is a view of configuration states for explaining the intermediate mapping data. In FIG. 3, reference numeral 21 denotes a state before shifting the allocation of processing among the processing elements; reference numeral 22 denotes a state after shifting the allocation of processing; and reference numeral 23 denotes an intermediate state in which the state before shifting and the state after shifting are integrated. The particulars of processing for each of the processing elements and the signal paths of the internal connection network in the state before shifting 21, the state after shifting 22, and the intermediate state 23 are determined based on the mapping data of the existing application, the final mapping data, and the intermediate mapping data, respectively.

When generating mapping data that defines the configuration after shifting 22, the processor 1 determines processing allocated to the processing elements as shiftable processing or non-shiftable processing. Shiftable processing is processing having a finite history dependent period in the processing element having the processing allocated thereto. In the allocation of processing based on the mapping data defining the configuration after shifting 22, shiftable processing is processing that can be allocated to a processing element different from the processing element allocated the processing based on the mapping data defining the state before shifting 21. For example, in a circuit configuration where flip-flops alone are provided and a loop circuit is not formed, the history dependent period is finite and corresponds to the number of the flip-flops.

The non-shiftable processing means processing having an infinite (indefinite) history dependent period in the processing element having the processing allocated thereto. In the allocation of processing based on the mapping data defining the state after shifting 22, non-shiftable processing is processing that is prohibited from being allocated to a processing element different from the processing element allocated the processing based on the mapping data defining the state before shifting 21. For example, excluding a special situation in which estimation from an algorithm, etc. is possible, the history dependent period becomes infinite in processing elements that correspond to a register file or a memory element. The history dependent period in a loop circuit, likewise, typically becomes infinite. A processing element having non-shiftable processing allocated thereto is referred to as a fixed processing element hereinafter.

Figure 4:
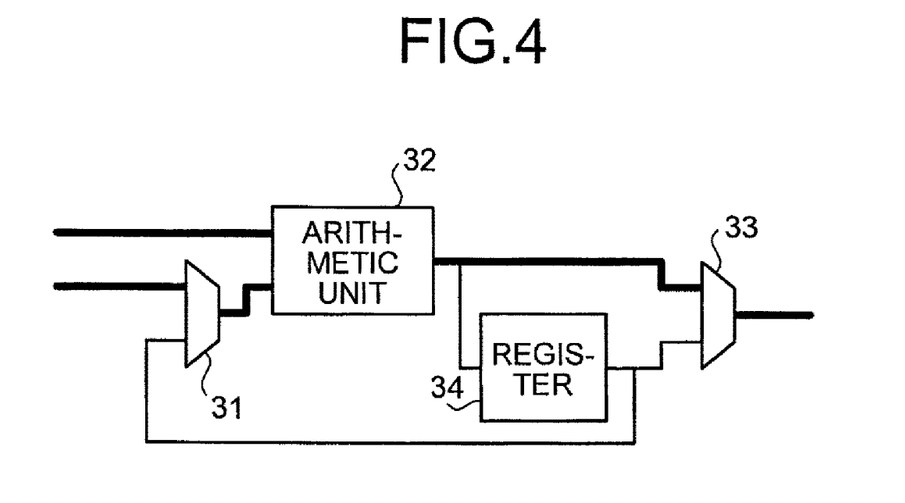
FIG. 4 is a view of an example of a processing element having shiftable processing allocated thereto.
Figure 5:
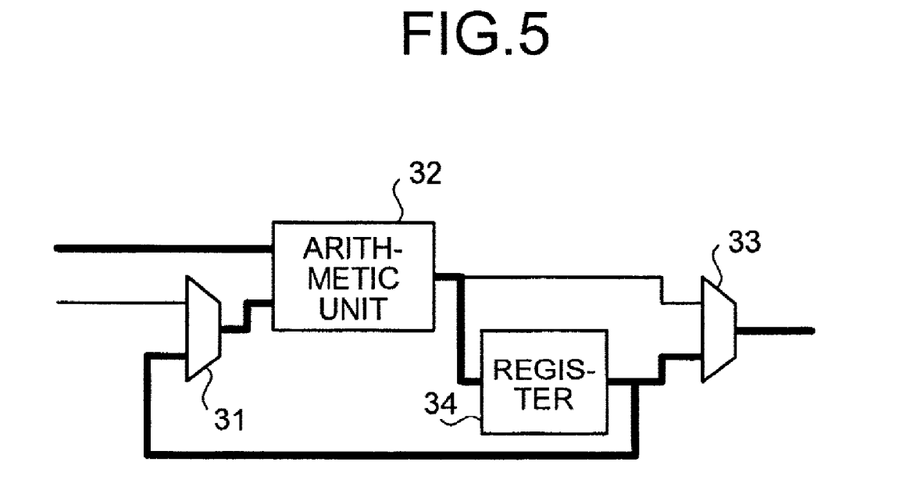
FIG. 5 is a view of an example of a processing element having non-shiftable processing allocated thereto

FIGS. 4 and 5 are views of examples of processing elements having shiftable processing and non-shiftable processing allocated thereto. As shown in FIGS. 4 and 5, a heavy line indicates a signal path of the internal connection network. The processing element depicted in FIG. 4 has a circuit configuration in which a selector 31 inputs one of two signals to an arithmetic unit 32 from a processing element upstream (not shown) and an arithmetic operation result of the two input signals is output to a processing element downstream (not shown) through a selector 33. In this example, the history dependent period is finite, and the processing is allocated as shiftable processing.

The processing element depicted in FIG. 5 has a circuit configuration in which one signal is input to the arithmetic unit 32 from a processing element upstream (not shown) and as another input signal thereto, an output signal from the arithmetic unit 32 is input through a register 34 and a selector 31. Further, an output signal from the register 34 is output to a processing element downstream (not shown) through the selector 33. In this example, the history dependent period is infinite, and the processing is allocated as non-shiftable processing.

As shown in FIG. 3, respective pieces of processing α1, α6, and α10 are non-shiftable processing, and the processing elements having the concerned processing allocated thereto are fixed processing elements. When generating the final mapping data or the intermediate mapping data from the mapping data of the existing application, the following constraints apply. As shown in FIG. 3, as a first constraint, the final mapping data allocates the same non-shiftable processing to the fixed processing elements having the non-shiftable processing (α1, α6, and α10) allocated thereto based on the mapping data of the existing application. That is, physical positions of the fixed processing elements are not changed.

As a second constraint, in the reallocation of processing that has been allocated based on the mapping data of the existing application, as indicated by an ellipse 24 in FIG. 3, shiftable processing (α2, α3, α4, α5, α7, α8, and α9) is reallocated based on the final mapping data such that newly allocated signal paths and/or processing elements do not conflict with the processing elements and/or the signal paths corresponding to the mapping data of the existing application.

That is, a processing element having certain processing allocated thereto based on the mapping data of the existing application cannot be reallocated with different processing based on the final mapping data. Further, a data path used to transfer given data based on the mapping data of the existing application cannot be utilized to transfer different data based on the final mapping data. However, concerning input to a fixed processing element, the data path can be changed.

The processor 1 extracts, from the final mapping data (corresponding to the state after shifting 22) generated under the constraints, a part different from that of the existing application and integrates this part with the mapping data of the existing application (the state before shifting 21) to generate intermediate mapping data (corresponding to the intermediate state 23). The intermediate mapping data is generated as follows. The processor 1 allocates processing based on the mapping data corresponding to either the state before shifting 21 or the state after shifting 22 because the constraints above prohibit the allocation of different processing to the same processing element by these two types of mapping data.

The processor 1 adopts a data path based on the mapping data corresponding to the state before shifting 21 and a data path based on the mapping data corresponding to the state after shifting 22 because different types of data do not conflict with each other except in the case of input to fixed processing elements. However, in some cases, the mapping data corresponding to the state before shifting 21 and the mapping data corresponding to the state after shifting 22 may indicate different data transfer sources for the fixed processing elements.

For example, the processing element having the processing α10 allocated thereto in FIG. 3 is such a case. In this example, the processor 1 adopts the path indicated by the mapping data corresponding to the state before shifting 21 as the data input path for fixed processing elements in the intermediate mapping data. Therefore, as indicated by an ellipse 25 in FIG. 3, in regard to the intermediate mapping data for the intermediate state (corresponding to the intermediate state 23), a data path between the processing element of α8 and the processing element of α10 indicated by the mapping data corresponding to the state after shifting 22 is not connected. Under such constraints, the intermediate mapping data is generated.

As apparent from FIG. 3, the intermediate mapping data (corresponding to the intermediate state 23) mapping a circuit and obtained by replicating a part of the mapping data of the existing application (state before shifting 21) to which a new part (a differing part) is added. When a replicated circuit includes a storage element, e.g., a flip-flop, the internal state of the storage element of the added new part (the differing part) is different from that of the original circuit formed based on the mapping data of the existing application (state before shifting 21).

Thus, the identical state achieving time is calculated as the time required, after the implementation of the intermediate mapping data in the arithmetic unit array 3, for the state of the replicated circuit to become the same as that of the original circuit. The identical state achieving time, for example, is determined based on a state in which data in an internal storage element is indefinite or set to an initial value, and is not dependent on history, such as immediately after resetting. The identical state achieving time commences from a point when such conditions are satisfied.

An identical state achieving time (TA) for the entire circuit is calculated from the following expressions (1) and (2). In these expressions, τp is an identical state achieving time (clock count) for a processing element p after shifting to reach the same state as the processing element before shifting, $t_p$ is an equilibrium state achieving time (clock count) when the same signal is input to the processing element p in a different state, and $1_{p-q}$ is a time required for a signal to arrive (clock count) from a processing element q to the processing element p. An identical state achieving time of a fixed processing element is determined as 0.

$$T_A = \max_{all\ PE} (\tau_{\square}) \quad (1)$$

-continued $$\tau_{\square\square\square}^{\square\square} + \max_{\text{fan in of } P=PE(\cdot)}(\tau_q +, \text{Œ}) \quad (2)$$

Figure 6:
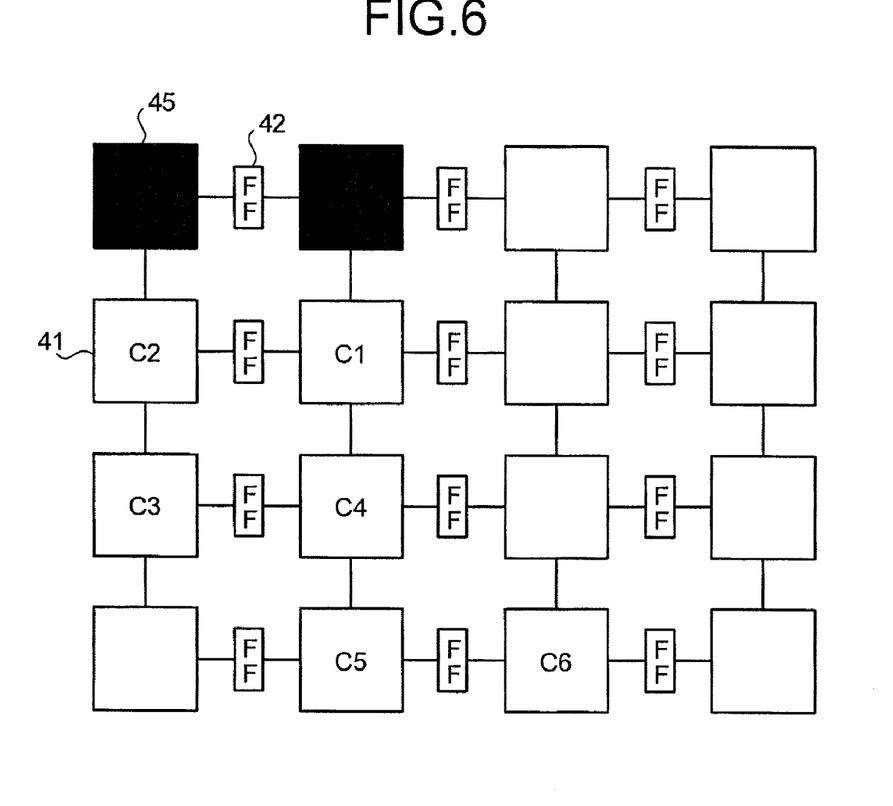
FIG. 6 is a view for explaining an identical state achieving time of an entire circuit.
Figure 7:
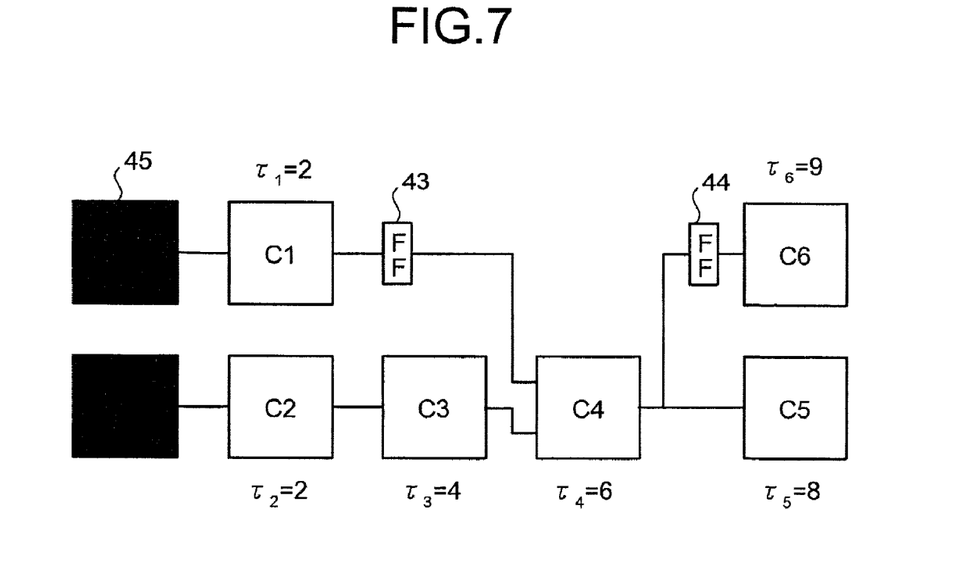
FIG. 7 is a view for explaining an identical state achieving time of an entire circuit.

Each of FIGS. 6 and 7 is a view for explaining an identical state achieving time of an entire circuit. In a circuit depicted in FIG. 6, data transfer between processing elements 41 in a lateral direction is carried out through each flip-flop 42. Therefore, delay varies depending on whether the data is transferred in the lateral direction or in a vertical direction. Accordingly, delay of the entire circuit varies depending on mapping. Thus, an identical state achieving time of the entire circuit must be calculated with consideration of data paths.

For example, in a data path such as that depicted in FIG. 7, flip-flops 43 and 44 are between a processing element C1 and a processing element C4, and between the processing element C4 and a processing element C6, respectively. Therefore, as delay caused by each of the flip-flops 43 and 44, one (1) must be added to the delay at each of these parts.

In the example depicted in FIG. 7, the maximum term in equation 2 with respect to the processing element C4 is 3 (=2+1) in a path from the processing element C1 and 4 (=2+2) in a path from the processing element C3. Therefore, the path from the processing element C3 is a limiting factor in the identical state achieving time for C4. Each black processing element 45 is a fixed processing element in FIGS. 6 and 7.

An upper limit of an identical state achieving time may be set, and this upper limit may be determined as a third constraint when generating intermediate mapping data. That is, under the third constraint, the identical state achieving time for intermediate mapping data equal to or below this upper limit value. In this case, mapping is re-executed until this condition is satisfied.

When calculating the identical state achieving time, timing for implementing intermediate mapping data may be added as a constraint. Then, the identical state achieving time can be reduced, and hence final mapping data can be implemented in a short time. For example, under a condition that intermediate mapping data is implemented immediately after resetting all flip-flops, all the flip-flops are initialized to, for example, 0 by resetting. Hence, there is no difference between a replicated circuit and an original circuit. Therefore, in this case, the identical state achieving time can be set to 0.

When the identical state achieving time is 0, final mapping data may be directly implemented in a state where mapping data of an existing application is implemented without implementing mapping data for an intermediate state. In this case, the final mapping data can be implemented in a shorter time.

Figure 8:
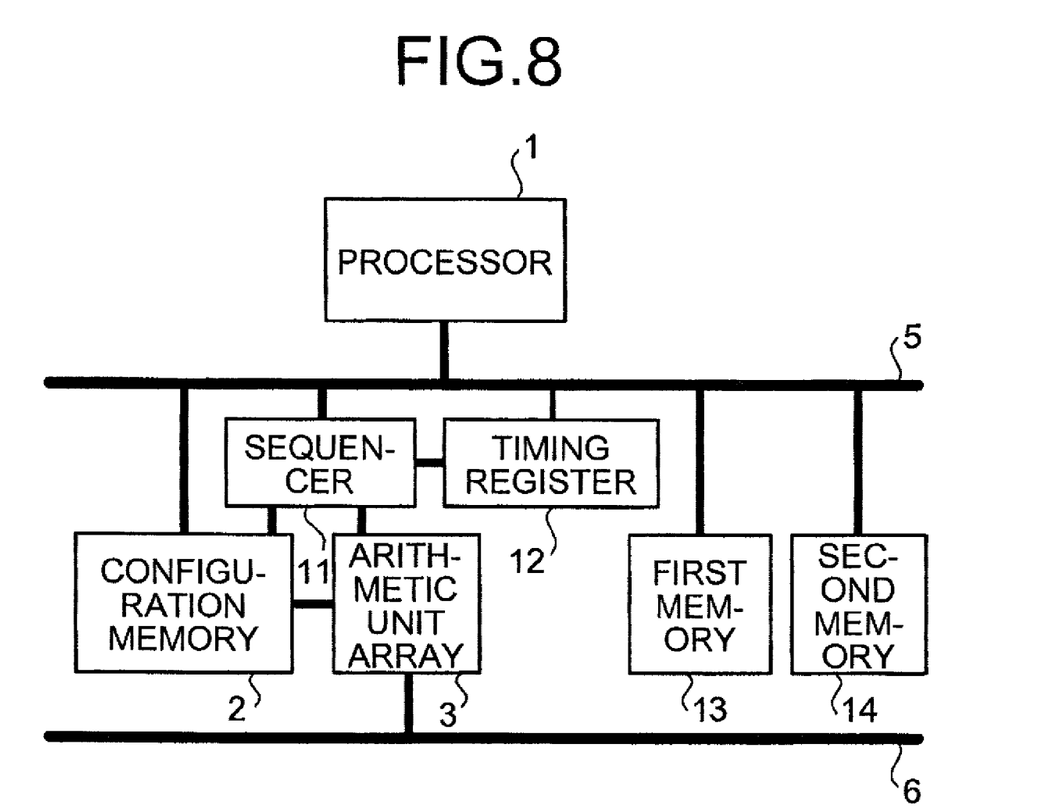
FIG. 8 is a block diagram of a structure of an integrated circuit apparatus according to a second embodiment of the present invention.

FIG. 8 is a block diagram of a structure of an integrated circuit apparatus according to the second embodiment of the present invention. As shown in FIG. 8, in the second embodiment, a sequencer 11 and a timing register 12 are added. The sequencer 11, the timing register 12, and a processor 1 realize a function of a control device. The sequencer 11 and the timing register 12 are connected with a configuration data bus 5. The sequencer 11 is connected with a configuration memory 2, an arithmetic unit array 3, and the timing register 12.

The timing register 12 stores an identical state achieving time calculated by the arithmetic unit array 3. The sequencer 11 monitors the timing register 12, and controls the timing of mapping data transfer from the configuration memory 2 to the arithmetic unit array 3. Therefore, in the second embodiment, the processor 1 executes operations exclusive of the function realized by the sequencer 11. Other structures are the same as those in the first embodiment.

In the second embodiment, a first memory 13 stores a logical data flow graph and a second memory 14 stores mapping data for the application being run. The data flow graph and the mapping data of the application being run are separately managed. The first memory 13 and the second memory 14 are connected with the configuration data bus 5.

Figure 9:
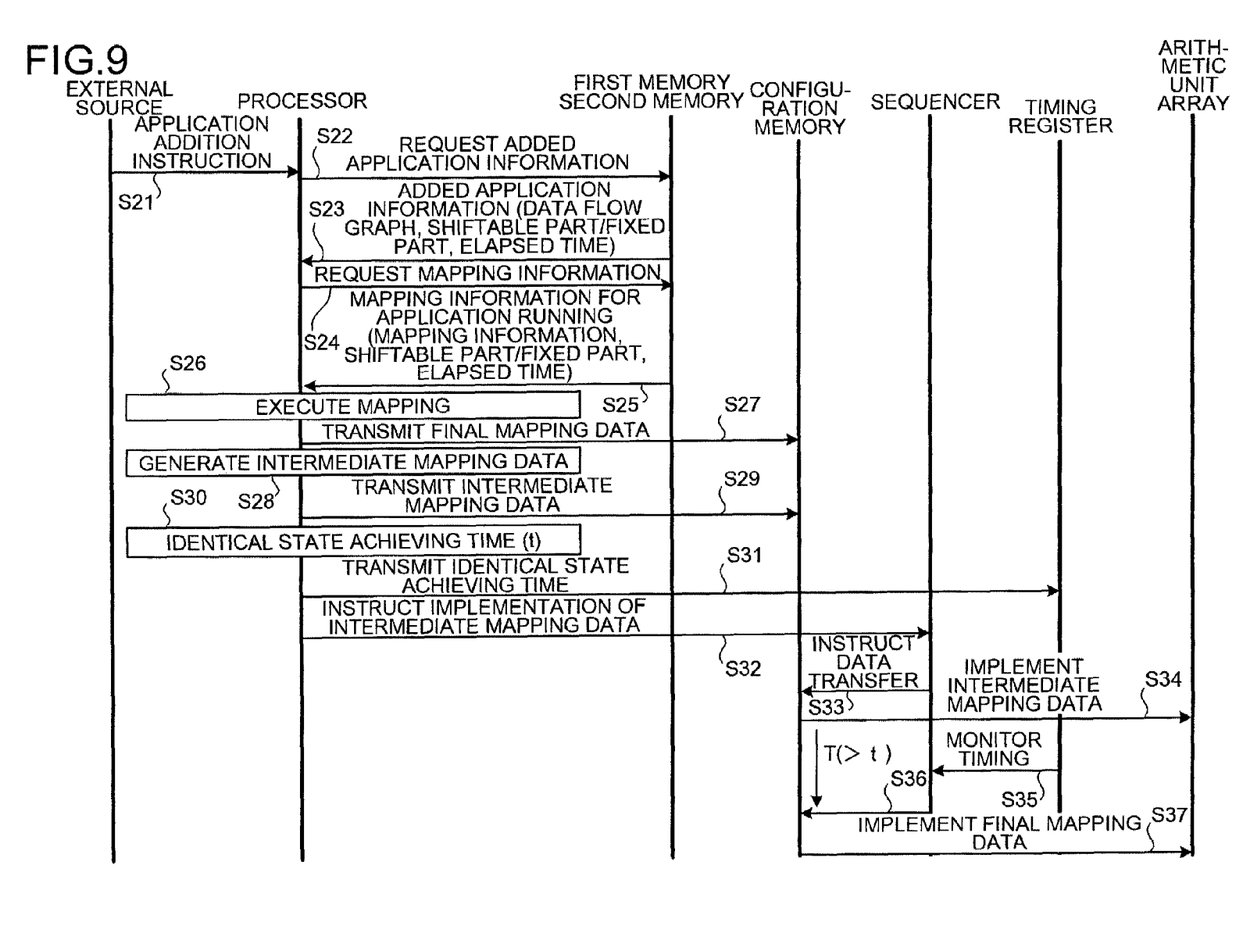
FIG. 9 is a flowchart of a processing procedure of the integrated circuit apparatus according to the second embodiment.

FIG. 9 is a flowchart of a processing procedure of the integrated circuit apparatus according to the second embodiment of the present invention. As shown in FIG. 9, while a given application is running, when the processor 1 receives an application addition instruction instructing the addition of another application (step S21), the processor 1 transmits an added-application information request to the first memory 13 (step S22). The processor 1 then reads a data flow graph of the added application from the first memory 13 (step S23).

The processor 1 also transmits a mapping information request to the first memory 13 and the second memory 14 (step S24). The processor 1 then reads a data flow graph and mapping information concerning an existing application from the first memory 13 and the second memory 14 (step S25). Here, a plurality of applications may be running as the existing application.

Similar to steps S6 to S9 in the first embodiment, the processor 1 sequentially executes generation of final mapping data (step S26), transmission of the final mapping data (step S27), generation of intermediate mapping data for an intermediate state (step S28), and transmission of the intermediate mapping data (step S29). The processor 1 subsequently calculates the identical state achieving time t (step S30). The processor 1 then transmits the generated identical state achieving time t to the timing register 12. The timing register 12 stores the identical state achieving time t (step S31).

The processor 1 then instructs the sequencer 11 to start implementation of the intermediate mapping data (step S32). Upon receiving the intermediate mapping start instruction, the sequencer 11 transmits a data transfer command to the configuration memory 2 (step S33). Upon receiving the data transfer command, the configuration memory 2 implements the intermediate mapping data stored therein in the arithmetic unit array 3 (step S34).

At the same time, the sequencer 11 monitors the timing register 12 (step S35). When the identical state achieving time t stored in the timing register 12 elapses after the implementation of the intermediate mapping data in the arithmetic unit array 3, the sequencer 11 transmits a data transfer command to the configuration memory 2 (step S36). Upon receiving this data transfer command, the configuration memory 2 implements the final mapping data stored therein in the arithmetic unit array 3 (step S37). When implementation of the final mapping data is successful, the processor 1 stores the mapping data concerning the final mapping in the second memory 14 and terminates a series of processing.

As explained above, according to each embodiment, the circuit configuration of the arithmetic unit array 3 shifts from a state in which mapping data of an existing application is implemented, through an intermediate state in which mapping data therefor is implemented, to a state in which final mapping data is implemented. Therefore, the circuit configuration of the arithmetic unit array 3 can be changed while an application is running without loss of the data that is being processed.

When adding and implementing another application in the arithmetic unit array 3 while a given application is running, the circuit configuration of the arithmetic unit array 3 shifts from a state in which mapping data of an existing application is implemented, through an intermediate state in which mapping data therefor is implemented, to a state in which final mapping data is implemented. Therefore, while a given application is running, another application can be newly implemented to be run without loss of the data that is being processed and without interruption of the processing that is being executed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An integrated circuit apparatus comprising:
an arithmetic operation device including a plurality of processing elements capable of executing commands and an internal connection network connecting the processing elements; and
a control device that generates, based on a data flow graph of an application, mapping data defining processing particulars for each of the processing elements and signal paths of the internal connection network, wherein
the control device generates third mapping data obtained by an integration of first mapping data and second mapping data that are generated based on a first data-flow graph, are different from each other and are for a first application that is being implemented, implements a circuit configuration for the arithmetic operation device based on the third mapping data, and subsequently implements the circuit configuration based on the second mapping data.

2. The integrated circuit apparatus according to claim 1, wherein the control device, when implementing a second application while the first application is running, generates fifth mapping data obtained by an integration of the second mapping data and fourth mapping data for the second application, implements the circuit configuration of the arithmetic unit device based on the third mapping data, and subsequently implements the circuit configuration based on the fifth mapping data, the second mapping data and the fourth mapping data being generated to enable implementation of both the first application and the second application.

3. The integrated circuit apparatus according to claim 2, wherein, the control device, when generating the second mapping data, allocates processing that is prohibited from being reallocated and for the first application, to a processing element allocated the processing based on the first mapping data.

4. The integrated circuit apparatus according to claim 3, wherein,
when the processing elements having an identical function allocated thereto respectively based on the first mapping data and the third mapping data are input with an identical signal, the control device calculates, as an identical state achieving time, a time required for a state of each of the processing elements, indicated by an internal state of an internal memory element thereof, to become identical, and
the control device implements the circuit configuration for the arithmetic operation device based on the third mapping data, waits for at least the identical state achieving time to elapse, and subsequently implements the circuit configuration based on the fifth mapping data.

5. The integrated circuit apparatus according to claim 4, wherein the control device determines the processing that is allocated to the processing element having the internal storage element with an indefinite data holding period, and for which the identical state achieving time is indefinite as the processing that is prohibited from being reallocated.

6. The integrated circuit apparatus according to claim 4, wherein the control device calculates the identical state achieving time commencing from a state in which data in the internal storage element is indefinite or set to an initial value.

7. The integrated circuit apparatus according to claim 4, wherein, the control device omits operations involved in implementing the circuit configuration of the arithmetic operation device based on the third mapping data, and shifts the circuit configuration implemented based on the first mapping data to the circuit configuration to be implemented based on the fifth mapping data, when the identical state achieving time is 0.

8. The integrated circuit apparatus according to claim 4, wherein the control device generates the second mapping data such that the identical state achieving time does not exceed a preset upper limit value.

* * * * *